United States Patent
Takano

(10) Patent No.: US 7,852,689 B2
(45) Date of Patent: Dec. 14, 2010

(54) SEMICONDUCTOR INTEGRATED CIRCUIT AND METHOD OF MEASURING A MAXIMUM DELAY

(75) Inventor: Hideto Takano, Kawasaki (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/354,209

(22) Filed: Jan. 15, 2009

(65) Prior Publication Data

US 2009/0201750 A1 Aug. 13, 2009

(30) Foreign Application Priority Data

Feb. 8, 2008 (JP) .............................. 2008-028884

(51) Int. Cl.
*G11C 7/00* (2006.01)
(52) U.S. Cl. .................... 365/189.18; 365/194; 365/191
(58) Field of Classification Search ................ 365/194, 365/191, 189.18
See application file for complete search history.

(56) References Cited

U.S. PATENT DOCUMENTS

| | | | |
|---|---|---|---|
| 4,502,117 A | 2/1985 | Kihara | |
| 5,892,957 A * | 4/1999 | Normoyle et al. | 710/263 |
| 6,034,542 A * | 3/2000 | Ridgeway | 326/39 |
| 6,253,333 B1 | 6/2001 | Bogumil et al. | |
| 6,499,072 B1 | 12/2002 | Frank et al. | |
| 7,181,639 B2 * | 2/2007 | Chua-Eoan et al. | 713/600 |
| 7,577,048 B2 * | 8/2009 | Felix | 365/194 |
| 2005/0228914 A1 * | 10/2005 | Ishida | 710/110 |
| 2006/0085600 A1 | 4/2006 | Miyashita et al. | |
| 2006/0285413 A1 * | 12/2006 | Shinozaki et al. | 365/222 |

FOREIGN PATENT DOCUMENTS

JP  58-151631 A  9/1983

* cited by examiner

*Primary Examiner*—Pho M Luu
*Assistant Examiner*—Han Yang
(74) *Attorney, Agent, or Firm*—Sughrue Mion, PLLC

(57) ABSTRACT

A semiconductor integrated circuit includes a memory, a master interface circuit that performs one of receiving a data transfer request from the memory and outputting a data transfer request to the memory, a slave interface circuit that performs one of receiving data from the memory and outputting data to the memory in response to the data transfer requests, and a delay circuit that delays a data transfer end signal that indicates one of an end of a data transfer from the memory and an end of a data transfer to the memory.

15 Claims, 6 Drawing Sheets

SEMICONDUCTOR INTEGRATED CIRCUIT AND METHOD OF MEASURING A MAXIMUM DELAY

BACKGROUND

1. Field of the Invention

The present invention relates to a semiconductor integrated circuit including two or more master interfaces performing data transfer request and a slave interface receiving the data transfer request, and a method of measuring a maximum delay of the semiconductor integrated circuit.

2. Description of Related Art

FIG. 5 shows a related semiconductor integrated circuit. Two or more master interface (IF) circuits 111a and 111b, and a slave IF circuit 131 are connected through a system bus control circuit 121. The master IF circuits 111a and 111b perform data transfer request for FIFO 151a and FIFO 151b on the slave IF circuit 131, and data transfer request from the FIFO 151a and FIFO 151b to the slave IF circuit 131. The slave IF circuit 131 is a circuit receiving the data transfer request from the master IF circuits 111a and 111b.

The system bus control circuit 121 includes an arbiter circuit 122 arbitrating use of a bus, a slave IF circuit 131, and a data selecting circuit 123 controlling transmission of data between the FIFOs 151a and 151b. The FIFOs 151a and 151b are controlled by FIFO control circuits 152a and 152b, respectively, for data input and output. Control signals Sa, Sb, and Sc are transmitted among the master IF circuits 111a and 111b, the slave IF circuit 131, and the arbiter circuit 122.

First, the detail of the control signal Sa, the control signal Sb and the control signal Sc will be explained. Unless mentioned otherwise, High means active in logic. The control signal Sa includes REQa, ACKa, RD/WRa, address a, data length a, RDa, and WRa. The control signal Sb includes REQb, ACKb, RD/WRb, address b, data length b, RDb, and WRb. The control signal Sc includes transfer start c, RD/WRc, address c, data length c, RDc, WRc, data input c, and data output c.

REQa, REQb: data transfer request signals from the master IF circuits 111a, 111b to the system bus control circuit ACKa,
ACKb: data transfer request accept signals from the system bus control circuit to the master IF circuits 111a, 111b
address a, address b: addresses of transfer data from the master IF circuits 111a, 111b to the slave IF circuit 131
data length a, data length b: lengths of transfer data from the master IF circuits 111a, 111b to the slave IF circuit 131
RD/WRa, RD/WRb: recognition signals of read (High) or write (Low) from the master IF circuits 111a, 111b to the slave IF circuit 131
RDa, RDb: read signals from the system bus control circuit 121 to the master IF circuits 111a, 111b
WRa, WRb: write signals from the system bus control circuit 121 to the master IF circuits 111a, 111b
address c: an address of transfer data from the system bus control circuit 121 to the slave IF circuit 131
data length c: a length of transfer data from the system bus control circuit 121 to the slave IF circuit 131
RD/WRc: a recognition signal of read (High) or write (Low) from the system bus control circuit 121 to the slave IF circuit 131
RDc: a read signal from the slave IF circuit 131 to the system bus control circuit 121
WRc: a write signal from the slave IF circuit 131 to the system bus control circuit 121
transfer start c: a data transfer start request signal from the system bus control circuit 121 to the slave IF circuit 131

Operation of the FIFO 151a and the FIFO control circuit 152a which is the control circuit thereof will now be explained. Data is input to the FIFO 151a as data input INa. The data is the one in which real time is important such as video or audio data and the FIFO 151a and the FIFO control circuit 152a cannot reject the data receiving. After the FIFO 151a has received the data, the FIFO control circuit 152a performs data transfer request to the slave IF circuit 131 by outputting the STARTa signal to the master IF circuit 111a. The FIFO control circuit 152a, in response to the input ENDa signal, recognizes that data transfer which has been requested previously is finished and next data is able to be transferred. Note that, in the initial state, the FIFO control circuit 152a can output the STARTa signal regardless of the ENDa signal. After outputting the STARTa signal, data input continues from the data input INa to the FIFO 151a. Therefore, if the ENDa signal is not input, the input data overflows the limited buffer of the FIFO 151a and data are damaged. In this case, for example, the FIFO control circuit 152a outputs an overflow detection signal to inform an external device of it.

Next, the data transfer from the master IF circuit 111a to the slave IF circuit 131 will be described with reference to a timing chart. FIG. 6 shows a timing chart of each signal in the related semiconductor integrated circuit. When the master IF circuit 111a receives a data transfer request STARTa signal from the FIFO control circuit 152a, the master IF circuit 111a outputs REQa to the system bus control circuit. At this time, in order to show it is a data output processing to the slave IF circuit 131, the master IF circuit 111a sets an RD/WRa signal to "Low", and outputs necessary values to an address a signal and a data length a signal.

The arbiter circuit 122 in the system bus control circuit 121 outputs a data transfer enable signal ACKa to the master IF circuit 111a while the other master IF circuits do not use the system bus. At the same time, the system bus control circuit 121 outputs address c signal, data length c signal, RD/WRc signal, and a transfer start c signal, which is start request signal of data transfer, to the slave IF circuit 131.

The slave IF circuit 131 outputs WRc signal or RDc signal to the system bus control circuit 121 in accordance with RD/WRc signal. In this timing chart, the master IF circuit 111a transfers the data to the slave IF circuit 131. In this case, WRc signal becomes "High". The slave IF circuit 131 receives the transfer data by a data output OUTc signal during the WRc signal being "High". The system bus control circuit 121 outputs WRc signal to the master IF circuit 111a which is valid at that time. That is, in this example, the system bus control circuit 121 sets the WRa signal which is sent to the master IF circuit 111a to "High".

The master IF circuit 111a outputs the transfer data by a data output a signal in sync with a clock signal during the WRa signal being "High". The master IF circuit 111a and the slave IF circuit 131 determine that all the data transfers have been finished when the data transfers of data number which are set to the data length a, c have been finished, respectively. As data length a and data length c are the same value, the master IF circuit 111a and the slave IF circuit 131 determine at the same time that the transfers of all data have been finished.

When the master IF circuit 111a has finished the data transfer, the master IF circuit 111a outputs an ENDa signal to the FIFO control circuit 152a which uses the master IF circuit 111a. The slave IF circuit 131 outputs an ENDc signal to circuits which are connected to the slave IF circuit 131. The arbiter circuit 122 in the system bus control circuit 121 also determines that the data transfer of the master IF circuit 111a has been finished by monitoring the control signal Sa and the control signal Sc accompanying the data transfer.

Next, an operation of the FIFO 151b and the FIFO control circuit 152b which is a control circuit of the FIFO 151b will be described. The FIFO 151b outputs data as a data output OUTb. This data is data in which real time is important such as video or audio data, and the FIFO 151b and the FIFO control circuit 152b must keep outputting the data. If the data output is completely stopped or the data output is stopped for more than a period which is acceptable to a data receiving side, a problem such as distortion of a video or an audio will occur. In these cases, the semiconductor integrated circuit informs an external of this problem by outputting underflow detection signal from the FIFO control circuit 152b. If the FIFO 151b is in the state where the FIFO 151b can receive the data, the FIFO control circuit 152b performs the data transfer request to the slave IF circuit 131 by outputting a START b signal to the master IF circuit 111b. The FIFO control circuit 152b recognizes that the data transfer which is previously requested is finished and next data can be transferred by receiving ENDb signal. Note that, in the initial state, the FIFO control circuit 152b can output the STARTb signal regardless of the ENDb signal.

Next, a data transfer from the slave IF circuit 131 to the master IF circuit 111b will be explained. In this example, receiving the data transfer request STARTb signal, the master IF circuit 111b inputs a data transfer request signal REQb to the system bus control circuit 121 one clock later than a REQa signal from the master IF circuit 111a. In this case, the master IF circuit 111b has to wait for a data transfer process termination of the master IF circuit 111a before performing a data transfer request. After the arbiter circuit 122 in the system bus control circuit determines a data transfer of the master IF circuit 111a and the slave IF circuit 131 is terminated (checks the system bus is not used by other masters), the arbiter circuit 122 sets an ACKb signal to High. Following this operation, the data transfer is performed in the same way as the data transfer of the master IF circuit 111a and the slave IF circuit 131 described above. In this case, since the data transfer is from the slave IF circuit 131 to the master IF circuit 111b, an RD/WRb signal is High.

As explained above, the waiting time until when the ACKb signal of the master IF circuit 111b becomes High depends on the data length and the timing of the data transfer processing of the master IF circuit 111a and the slave IF circuit 131.

However, the time for data transfer completion is not constant for various reasons (software processing content, interruption processing of an LSI external input signal, and variations of compression/expansion processing amount of video/audio data) in accessing the slave IF circuit by the master IF circuit. Thus, the operation check in a condition where the system bus is under a peak load is extremely difficult, or it may be impossible to even determine whether the load is the peak load or not.

By the way, a DMA bus load varying device to perform concurrence test of a DMA device, peak load test, and appreciation of system performance without connecting a plurality of DMA devices to a DMA bus is disclosed in Japanese Unexamined Patent Application Publication No. 58-151631 (patent document 1). In the technique disclosed in patent document 1, a request of the DMA bus can be executed by an optional transfer period, an optional transfer area, and an optional mode (memory mode/write). Further, a timer to measure j period until the completion of the block transfer having any desired size is optionally provided to have a function as a DMA bus load varying device and a DMA bus simulator.

SUMMARY

As described above, according to the related semiconductor integrated circuit, the FIFO 151a is connected to an encoder encoding the video or audio, for example, and data which is encoded in real time is input to the FIFO 151a. However, when the data transfer from the FIFO 151a is suspended, the FIFO overflows. Additionally, the FIFO 151b is connected to a decoder decoding the video or audio, and the data needs to be output to the decoder as needed in order to reproduce the data in real time. However, the data transfer to the FIFO 151b may be suspended depending on the bus usage state, which causes delay of data output to the decoder and causes underflow. In the related semiconductor integrated circuit, it is difficult to check the circuit with the condition that the overflow or underflow is caused in the FIFOs 151a and 151b. In other words, when the salve IF circuit transfers data in accordance with the access from other master IF circuits, the data transfer is suspended until completion of this processing. When the plurality of master IF circuits access the system bus at the same time, the data transfer is also suspended even when other master IF circuits are prioritized by setting an order of priority. However, this technique has problems in that it is difficult to predict how long the master IF circuit has to wait for data transfer, and the required test cannot be performed.

Furthermore, although the measurement is performed by changing the load of the bus in the method of patent document 1, it is impossible to conduct the test by assuming in which situation a load is to be imposed on the bus and which load is to be imposed on the bus without changing the load of the bus.

According to an exemplary embodiment of the present invention, there is provided a semiconductor integrated circuit includes a memory, a master interface circuit that performs one of receiving a data transfer request from the memory and outputting a data transfer request to the memory, a slave interface circuit that performs one of receiving data from the memory and outputting data to the memory in response to the data transfer requests, and a delay circuit that delays a data transfer end signal that indicates one of an end of a data transfer from the memory and an end of a data transfer to the memory.

According to another exemplary embodiment of the present invention, there is a provided a method of measuring a maximum delay of a semiconductor integrated circuit. The semiconductor integrated circuit includes a master interface circuit performs one of operations outputting a data transfer request to transfer data from a memory to a slave interface circuit and receiving a data transfer request to transfer data from the slave interface circuit to the memory, and a slave interface circuit performs one of operations receiving the data transfer request from the master interface circuit and outputting the data transfer request to the master interface circuit. The method includes inputting one of the data transfer request from the master interface circuit and the data transfer request from the slave interface circuit, delaying a data transfer end signal indicating an end of a data transfer to generate a delayed data transfer end signal, and transferring data either from the memory to the slave interface circuit or from the slave interface circuit to the memory after receiving the delayed data transfer end signal.

According to the present invention, a data transfer end signal can be delayed by a delay circuit, whereby the timing for starting the data transfer of each master interface can be delayed. Accordingly, it is possible to create the state where the data transfer requests from the plurality of master interfaces are produced in the bus (state where the bus is under the peak load), whereby it is possible to conduct the test whether the system operates normally under such a condition.

According to the present invention, it is possible to provide a semiconductor integrated circuit which enables the test in a state where the bus is under the peak load and the maximum delay is caused in data transfer, and a method of measuring a maximum delay of the semiconductor integrated circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Embodiments of the present invention will now be described with reference to the accompanying drawings. These embodiments show the case when the present invention is applied to a semiconductor integrated circuit including a slave IF circuit receiving a data transfer request from two or more master IF circuits and the master IF circuits performing the data transfer request.

A semiconductor integrated circuit according to the present exemplary embodiment creates easily a condition similar to one in which a system bus is under the maximum load (peak load), without increasing the actual system bus load. Therefore, it is possible to perform an operation check of a system LSI with the system bus under the peak load.

First Exemplary Embodiment

Figure 1:
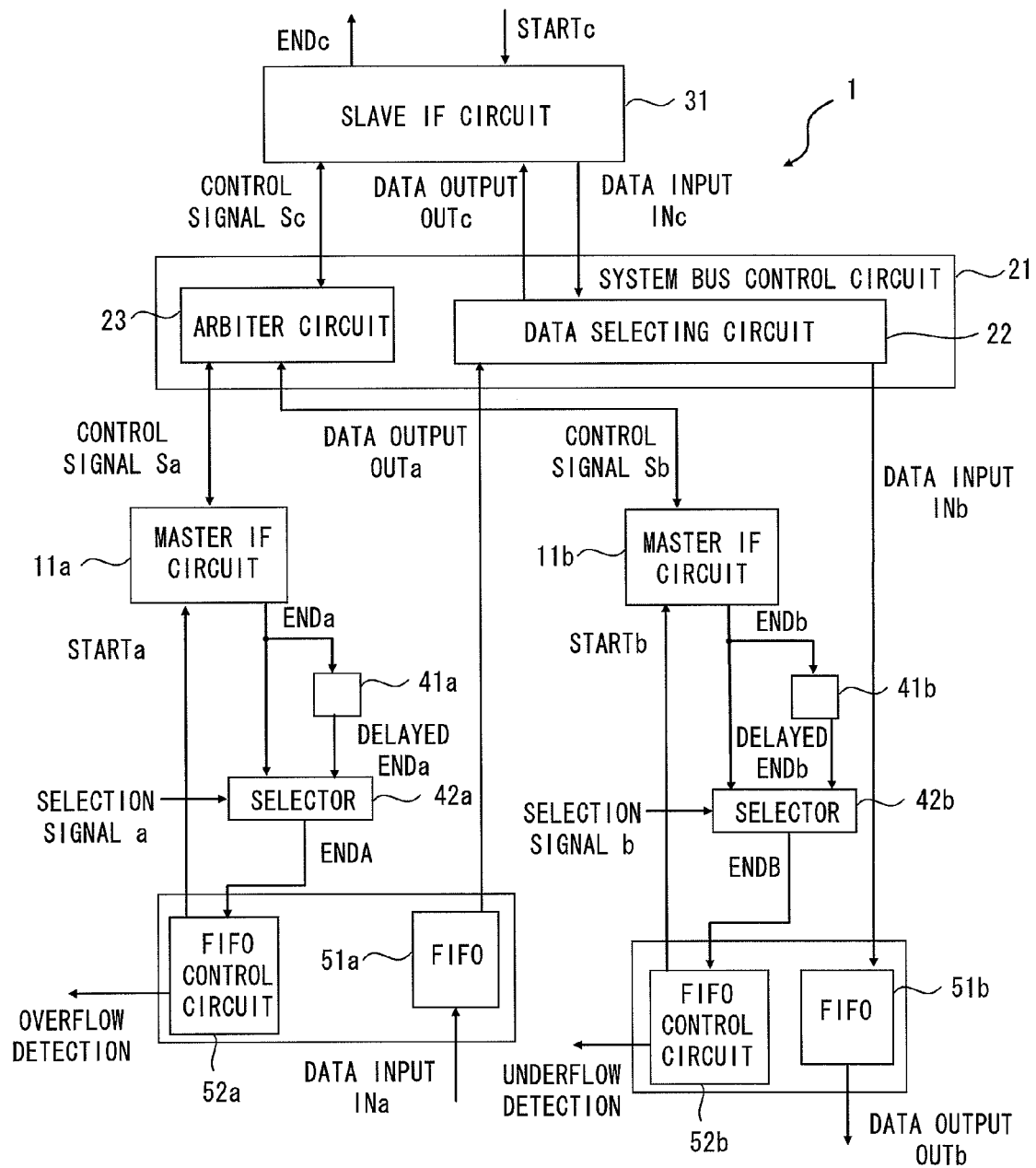
FIG. 1 shows a semiconductor integrated circuit according to a first exemplary embodiment of the present invention.

FIG. 1 is a view showing a semiconductor integrated circuit according to the present embodiment. A semiconductor integrated circuit 1 includes master IF circuits 11a, 11b, a slave IF circuit 31, a system bus control circuit 21, FIFOs 51a, 51b and FIFO control circuits 52a, 52b. The master IF circuits 11a, 11b receive a data transfer request from the FIFO control circuits 52a, 52b and output the data transfer request to the slave IF circuit 31 through the system bus control circuit 21, and receive a data transfer request from the slave IF circuit 31 through the system bus control circuit 21 and output the data transfer request to the FIFO control circuits 52a, 52b.

The slave IF circuit 31 receives the data transfer request from the master IF circuits 11a, 11b through the system bus control circuit 21, and outputs the data transfer request to send data to the FIFOs 51a, 51b. The system bus control circuit 21 receives or outputs data depending on the data transfer requests from the master IF circuits 11a, 11b. The FIFOs 51a, 51b provide data to the system bus control circuit 21 or receives data from the system bus control circuit 21 depending on the data transfer requests of the master IF circuits 11a, 11b. The FIFO control circuits 52a, 52b control the data input and output of the FIFOs.

The semiconductor integrated circuit 1 according to the exemplary embodiment includes delay circuits 41a, 41b delaying data transfer end signals by a delay time which show the end of data transfer from FIFOs 51a, 51b or to FIFOs 51a, 51b in order to create the system bus under the peak load. The delay time may be set to the delay circuits 41a, 41b from external, and the delay time may be calculated based on a simulation.

The semiconductor integrated circuit 1 further includes selectors 42a, 42b selecting data transfer end signals ENDa, ENDb from the master IF circuits 11a, 11b or delayed ENDa signal, delayed ENDb signal which have been delayed in the delay circuits 41a, 41b to provide the FIFOs 51a, 51b with them as ENDA signal, ENDB signal.

The system bus control circuit 21 includes an arbiter circuit 23 arbitrating data transfer requests from the master IF circuits 11a, 11b and a data selecting circuit 22 controlling the data input and output between the slave IF circuit 31 and the FIFOs 51a, 51b.

First, the detail of a control signal Sa, a control signal Sb and a control signal Sc will be explained. Unless mentioned otherwise, High means active in logic. The control signal Sa is transferred between the master IF circuit 11a and the arbiter circuit 23. The control signal Sb is transferred between the master IF circuit 11b and the arbiter circuit 23. The control signal Sc is transferred between the slave IF circuit 31 and the arbiter circuit 23. The control signal Sa includes REQa, ACKa, RD/WRa, address a, data length a, RDa and WRa. The control signal Sb includes REQb, ACKb, RD/WRb, address b, data length b, RDb and WRb. The control signal Sa includes transfer start c, RD/WRc, address c, data length c, RDc, WRc, data input c and data output c.

REQa, REQb: data transfer request signals from the master IF circuits 11a, 11b to the system bus control circuit ACKa, ACKb: data transfer request accept signals from system bus control circuit to the master IF circuits 11a, 11b address a, address b: addresses of transfer data from the master IF circuits 11a, 11b to the slave IF circuit 31 data length a, data length b: lengths of transfer data from the master IF circuits 11a, 11b to the slave IF circuit 31

RD/WRa, RD/WRb: recognition signals of read (High) or write (Low) from the master IF circuits 11a, 11b to the slave IF circuit 31

RDa, RDb: read signals from the system bus control circuit 21 to the master IF circuits 11a, 11b WRa, WRb: write signals from the system bus control circuit 21 to the master IF circuits 11a, 11b address c: an address of transfer data from the system bus control circuit 21 to the slave IF circuit 31 data length c: a length of transfer data from the system bus control circuit 21 to the slave IF circuit 31

RD/WRc: a recognition signal of read (High) or write (Low) from the system bus control circuit 21 to the slave IF circuit 31

RDc: a read signal from the system bus control circuit 21 to the slave IF circuit 31

WRc a write signal from the slave IF circuit 31 to the system bus control circuit 21

Transfer start c: a data transfer start request signal from the slave IF circuit 31 to the system bus control circuit 21

Operation of the FIFO 51a and the FIFO control circuit 52a which is the control circuit thereof will be explained. Data is input to the FIFO 51a as data input INa. The data is the one in which real time is important such as video or audio data and the FIFO 51a and the FIFO control circuit 52a cannot reject the data receiving. After the FIFO 51a has received the data, the FIFO control circuit 52a performs data transfer request to the slave IF circuit 31 by outputting the STARTa signal to the master IF circuit 11a. The FIFO control circuit 52a, in response to the input ENDA signal, recognizes that data transfer which has been requested previously is finished and next data is able to be transferred. Note that, in the initial state, the FIFO control circuit 52a can output the STARTa signal regardless of the ENDA signal. After outputting the STARTa signal, data input continues from the data input INa to the FIFO 51a. Therefore, if the ENDA signal is not input, the input data overflows the limited buffer of the FIFO 51a and data are damaged. In this case, for example, the FIFO control circuit 52a outputs an overflow detection signal to inform an external device of it.

An encoder which encodes data such as video data and audio data inputs data to the FIFO 51a. As discussed previously, although the FIFO 51a cannot stop an input from the encoder, the encoder cannot use the bus while other master IF circuits use the bus. Note that this described embodiment has two buses but the semiconductor integrated circuit may have more than two buses.

In case there are several master IF circuits, the arbiter circuit 23 restricts the use of the bus by each of them. Therefore it is important to inspect, when the system is under load, circuits connected to and inputting data to the FIFO for errors or inspect circuits receiving data from the FIFO for errors. Especially, the load (peak load) on the bus changes depending on the process mode or processing of video or audio data. For example, the master IF circuit 11a transfers data after the processing of the master IF circuit 11b, and it is necessary to inspect the system taking into consideration how long the master IF circuit 11a will be kept waiting for data transfer when the peak load is imposed on the bus.

This exemplary embodiment has the delay circuits 41a, 41b to delay the data transfer end signals ENDa, ENDb so as to create the condition where the bus is under the peak load. The delay circuits 41a, 41b delay the data transfer end signals ENDa, ENDb, and output delayed ENDa signal, delayed ENDb signal as ENDA signal, ENDB signal. This delayed signals create the waiting time for the master IF circuit to wait for using the bus when the bus is under the peak load. This allows inspection of the system with the bus under the peak load. That is, it allows inspection whether the process fails or not in the encoder or decoder connected to the former stage of the FIFO. The amount of delay by the delay circuits 41a, 41b can be set from external or CPU (not shown).

Firstly, the data transfer from the master IF circuit 11a to the slave IF circuit 31 will be described. When the master IF circuit 11a receives a data transfer request STARTa from the FIFO control circuit 52a, the master IF circuit 11a outputs REQa to the system bus control circuit 21. At this time, in order to show it is a data output processing to the slave IF circuit 31, the master IF circuit 11a sets an RD/WRa signal to "Low", and outputs necessary values to an address a signal and a data length a signal.

The arbiter circuit 23 in the system bus control circuit 21 outputs a data transfer enable signal ACKa to the master IF circuit 11a while the other master IF circuits do not use the system bus. At the same time, the system bus control circuit 21 sends address c signal, data length c signal, RD/WRc signal and a transfer start c signal, which is start request signal of data transfer, to the slave IF circuit 31.

The slave IF circuit 31 outputs WRc signal or RDc signal to the system bus control circuit 21 in accordance with RD/WRc signal. In this example, the master IF circuit 11a transfers the data to the slave IF circuit 31. In this case, WRc signal becomes "High". The slave IF circuit 31 receives the transfer data by a data output OUTc signal during the WRc signal being "High". The system bus control circuit 21 outputs WRc signal to the master IF circuit 11a which is valid at that time. That is, in this example, the system bus control circuit 21 sets the WRa signal which is sent to the master IF circuit 11a to "High".

The master IF circuit 11a outputs the transfer data by a data output a signal in sync with a clock signal during the WRa signal being "High". The master IF circuit 11a and the slave IF circuit 31 determine that the data transfers have been finished when the data transfers of data number which are set to the data length a, c have been finished respectively. As data length a and data length c are the same value, the master IF circuit 11a and the slave IF circuit 31 determine at the same time that the transfers of all data have been finished.

When the master IF circuit 11a has finished the data transfer, the master IF circuit 11a outputs an ENDa signal to the FIFO control circuit 52a which uses the master IF circuit 11a. The slave IF circuit 31 outputs an ENDc signal to circuits which are connected to the slave IF circuit 31. The arbiter circuit 23 in the system bus control circuit 21 also determines that the data transfer of the master IF circuit 11a has been finished by monitoring a control signal Sa and a control signal Sc accompanying the data transfer.

The delay circuit 41a delays the ENDa signal and generates delayed ENDa signal and outputs the delayed ENDa signal. The selector 42a outputs the delayed ENDa signal as ENDA signal to the master IF circuit 11a if the selection signal a has been set to the system bus peak load test mode. When the selection signal a is not set to the system bus peak load test mode, the selector 42a outputs the ENDa signal directly as ENDA signal.

After the delayed ENDA signal is input to the master IF circuit 11a, the master IF circuit 11a performs a transfer request to the system bus by using a control signal a. Note that, in the initial state, after STARTa signal has been input to the master IF circuit 11a, the master IF circuit 11a performs the transfer request to the system bus by using the control signal a, without the delayed ENDA signal input.

As described above, since the master IF circuit 11a is formed so as to perform the data transfer request after the delayed ENDA signal has been input, a usage of the bus is stopped during the time which is longer than actual ENDa signal. It is possible to execute the test of semiconductor integrated device with the system bus under a peak load by setting this amount of delay of the delay circuit 41a to the value which can create the waiting time in the condition where the bus is under the peak load.

Next, an operation of the FIFO 51b and the FIFO control circuit 52b which is a control circuit of the FIFO 51b will be described. The FIFO 51b outputs data as a data output OUTb to the former stage, a decoder, for example. This data is data in which real time is important such as video or audio data, and the FIFO 51b and the FIFO control circuit 52b must keep outputting the data. If the data output is completely stopped or the data output is stopped for more than a period which is acceptable to a data receiving side, a problem such as distortion of a video or an audio will occur. In these cases, the semiconductor integrated circuit informs an external of this problem by outputting underflow detection signal from the FIFO control circuit 52b. If the FIFO 51b is in the state where the FIFO 51b can receive the data, the FIFO control circuit 52b performs the data transfer request to the slave IF circuit 31 by outputting a START b signal into the master IF circuit 11b. The FIFO control circuit 52b recognizes that the data transfer which is previously requested is finished and next data can be transferred by receiving ENDb signal. Note that, in the initial state, the FIFO control circuit 52b can output the STARTb signal regardless of the ENDb signal.

Next, a data transfer from the slave IF circuit 31 to the master IF circuit 11b will be explained. In this example, receiving the data transfer request STARTb signal, the master IF circuit 11b inputs a data transfer request REQb to the system bus control circuit 21 one clock later than a REQa signal from the master IF circuit 11a. In this case, the master IF circuit 11b has to wait for a data transfer process termination of the master IF circuit 11a before performing a data transfer request. After the arbiter circuit 23 in a system bus control circuit determines a data transfer of the master IF circuit 11a and the slave IF circuit 31 is terminated (checks the system bus is not used by other masters), the arbiter circuit 23 sets an ACKb signal to High. Following this operation, the data transfer is performed in the same way as the data transfer of the master IF circuit 11a and the slave IF circuit 31. In this case, since the data transfer is from the slave IF circuit 31 to the master IF circuit 11b, an RD/WRb signal is High.

As this exemplary embodiment has two master IF circuits, the master IF circuit 11b only waits for a data transfer of the master IF circuit 11a. However, the waiting time depends on a data length which is operated by the master IF circuit 11a. Therefore the semiconductor integrated circuit cannot operate the master IF circuit 11b with the waiting time when the bus is under the peak load. However, the semiconductor integrated circuit according to the exemplary embodiment includes the delay circuit 41b, which produce the delayed ENDB signal from the ENDb signal. Therefore the ENDB signal in the state where the bus is under the peak load can be created by the delayed ENDb signal, and the test under a peak load can be executed.

According to the exemplary embodiment, the same condition where the system bus is under a peak load with respect to the FIFOs 51a, 51b which are former stages of the master IF circuits can be created easily. Therefore it is possible to perform an operation check of a system LSI under this condition easily. In the related technique, it is extremely difficult to create this condition. On the other hand, according to the exemplary embodiment, a data transfer delay in the condition where the system bus is under a peak load virtually with respect to the FIFOs 51a, 51b which are former stages of the master IF circuits 11a, 11b can be created by the delay circuits 41a, 41b. That is, if the ENDa signal is delayed by an amount of delay which is obtained by calculation or test preliminary, the operation check in the delay condition of the system bus can be easily executed without changing the current construction of system including software and so on.

Second Exemplary Embodiment

Figure 2:
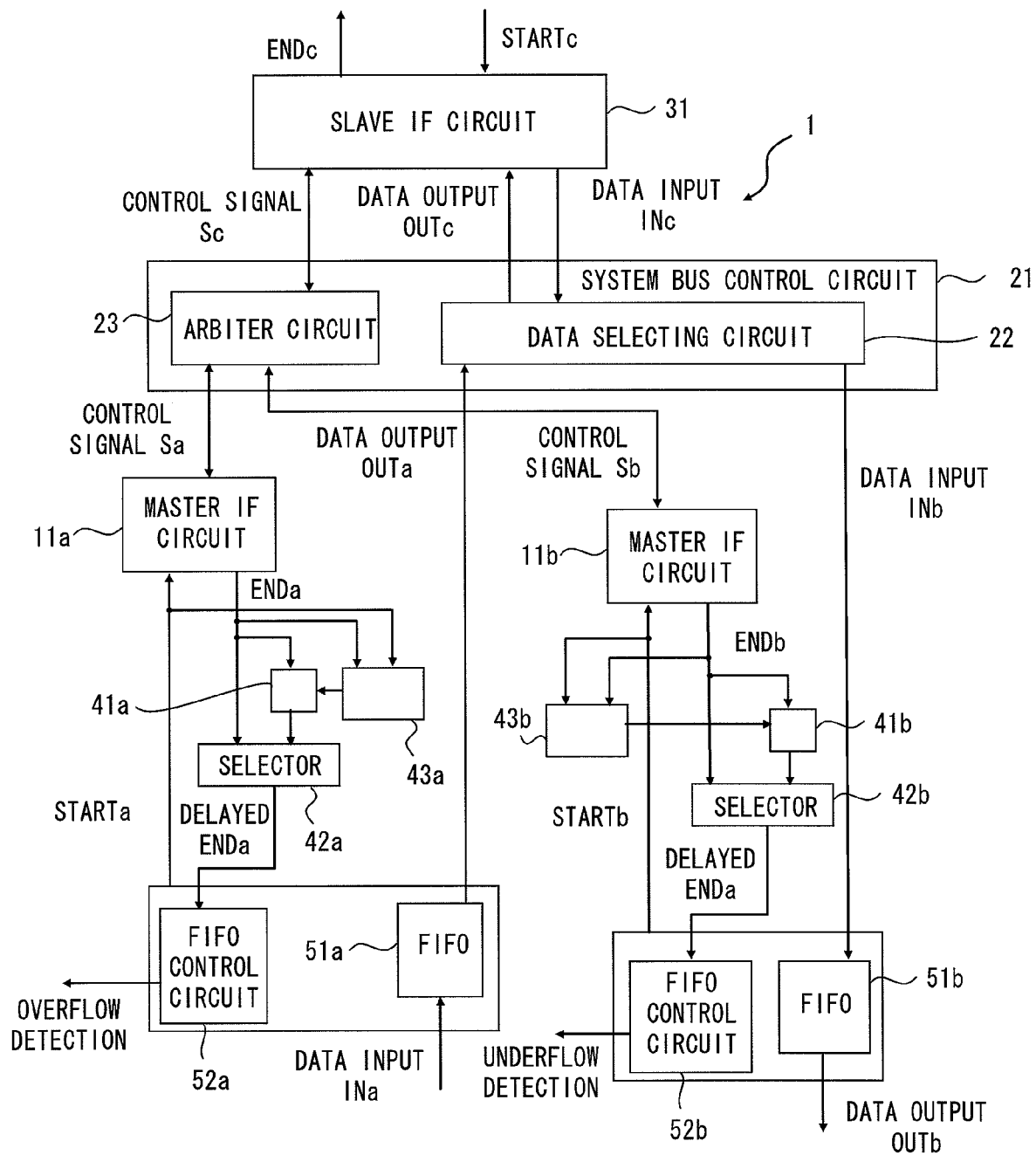
FIG. 2 shows a semiconductor integrated circuit according to a second exemplary embodiment of the present invention.

Next, a second exemplary embodiment of the present invention will be explained. FIG. 2 is a view showing a semiconductor integrated circuit according to the second exemplary embodiment. Note that, in the second exemplary embodiment shown in FIG. 2 and a third exemplary embodiment shown in FIG. 3 described later, the same elements as those in the first exemplary embodiment are denoted by the same reference symbols and not described in detail herein.

As shown in FIG. 2, according to the exemplary embodiment, a semiconductor integrated circuit includes maximum delay amount measurement circuits 43a, 43b in addition to the delay circuits 41a, 41b and the selectors 42a, 42b. The maximum delay amount measurement circuits 43a, 43b determine a delay amount by STARTa signal, STARTb signal, ENDa signal and ENDb signal. The maximum delay amount measurement circuits 43a, 43b set the determined delay amount in the delay circuits 41a, 41b. The delay circuits 41a, 41b output a delayed ENDa signal, a delayed ENDb signal which is obtained by delaying an ENDa signal, an ENDb signal in accordance with this amount.

In the second exemplary embodiment as well as the first exemplary embodiment, the same condition where the system bus is under a peak load with respect to the FIFOs 51a, 51b which are former stages of the master IF circuits can be created easily. That is, the delay circuits 41a, 41b can create a data transfer delay virtually in the condition where the system bus is under a peak load with respect to the FIFOs 51a, 51b which are former stages of the master IF circuits 11a, 11b. Therefore, if the ENDa signal is delayed by an amount which is obtained by calculation or test preliminary, the operation check in the delay condition of the system bus can be easily executed without changing the current construction of system including software and so on.

Furthermore, the exemplary embodiment includes the maximum delay amount measurement circuits 43a, 43b and the maximum delay amount measurement circuits 43a, 43b count a time from a STARTa signal to an ENDa signal. The delay amount when the system bus is under the peak load may be larger than the value obtained by calculation in advance. The related technique cannot perform the test under unpredictable delay like this. However, in this exemplary embodiment, the maximum delay amount measurement circuits 43a, 43b count the delay of the case where system operates actually, and set the maximum value in the delay circuits 41a, 41b. Therefore the test under a peak load can be performed easily.

Third Exemplary Embodiment

Figure 3:
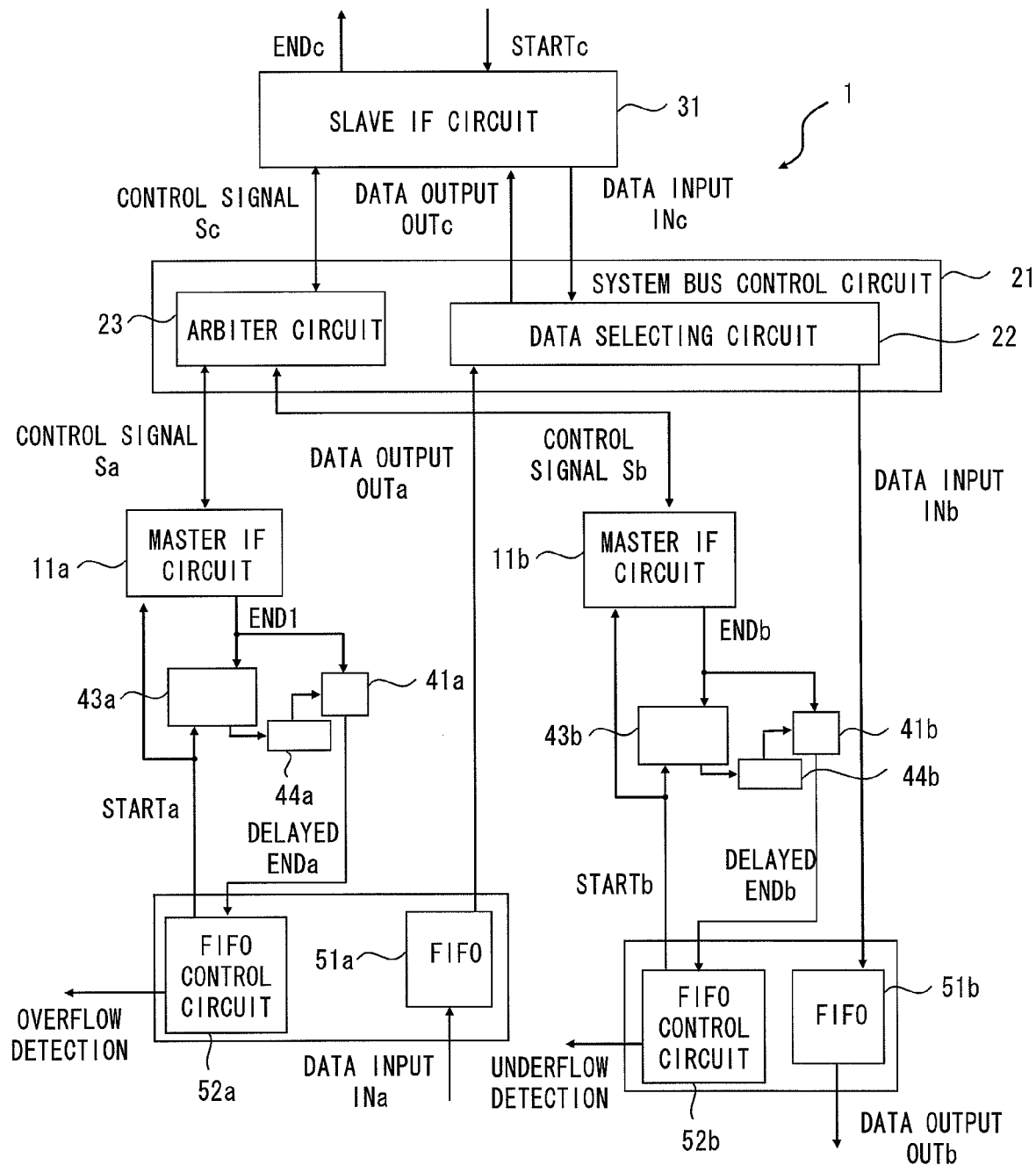
FIG. 3 shows a semiconductor integrated circuit according to a third exemplary embodiment of the present invention.

Next, a third exemplary embodiment of the present invention will be explained. FIG. 3 is a view showing a semiconductor integrated circuit according to the exemplary embodiment. In this exemplary embodiment, the semiconductor integrated circuit includes delay setting registers 44a, 44b and maximum delay amount measurement circuits 43a, 43b between the master IF circuits 11a, 11b and FIFO control circuits 52a, 52b which send STARTa signal, STARTb signal to the master IF circuits 11a, 11b in addition to the delay circuits 41a, 41b.

The maximum delay amount measurement circuits 43a, 43b measure the number of clocks from START signal to END signal. Then, in the case where the measurement value is more than the number of the clocks in last data transfer, the delay setting registers 44a, 44b store this value. The delay setting registers 44a, 44b also store a setting value from a microcomputer and so on. When the END signal is input earlier than the setting value of the delay setting registers 44a, 44b, the delay circuits 41a, 41b delay the delayed ENDa signal and the delayed ENDb signal until the setting value of the delay setting registers 44a, 44b. When the END signal is input later than the setting value of the delay setting registers 44a, 44b, the delay circuits 41a, 41b output the delayed ENDa signal and the delayed ENDb signal without changing the timing of the END signals.

Figure 4:
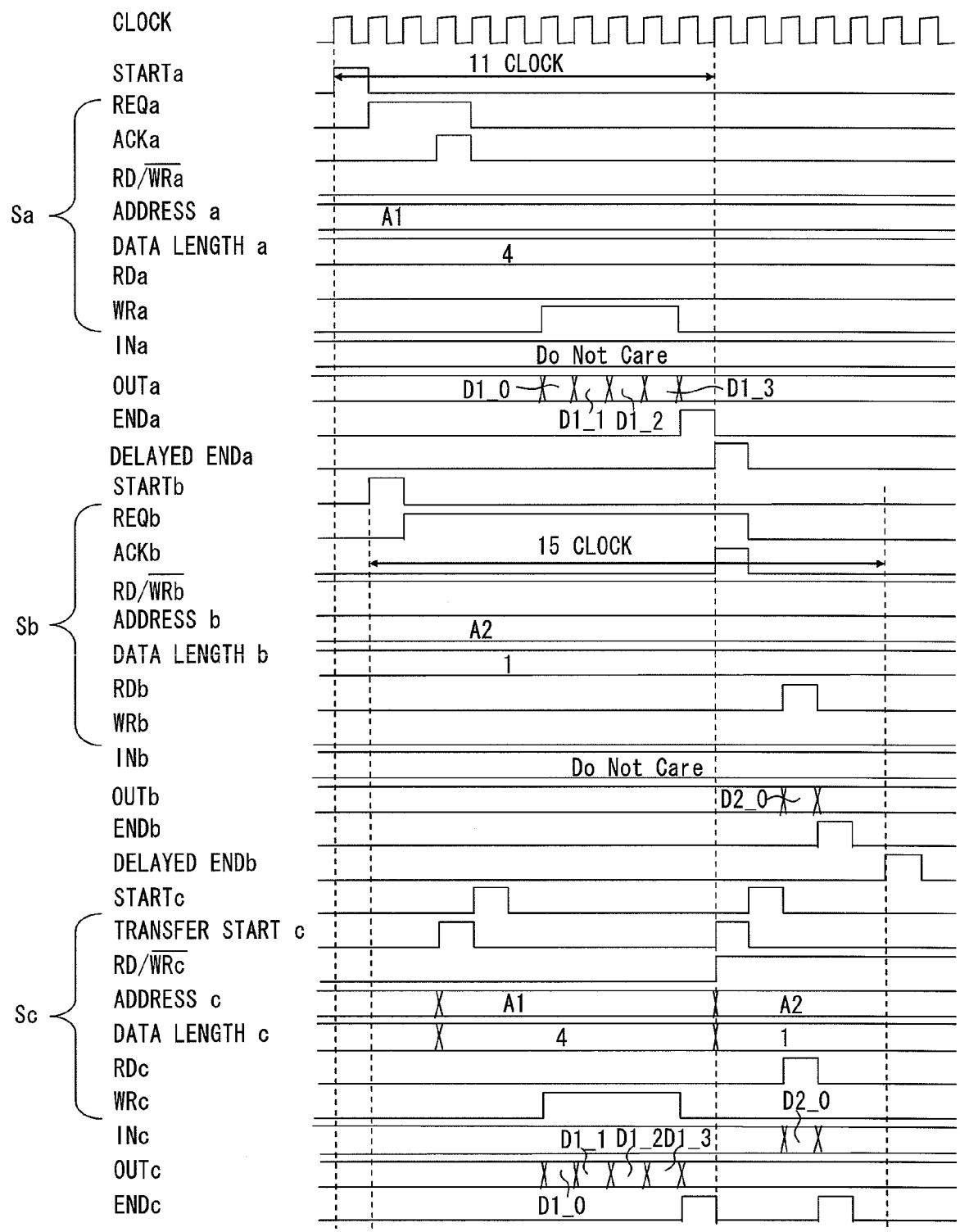
FIG. 4 shows a timing chart of each signal according to the third exemplary embodiment of the present invention.
Figure 5:
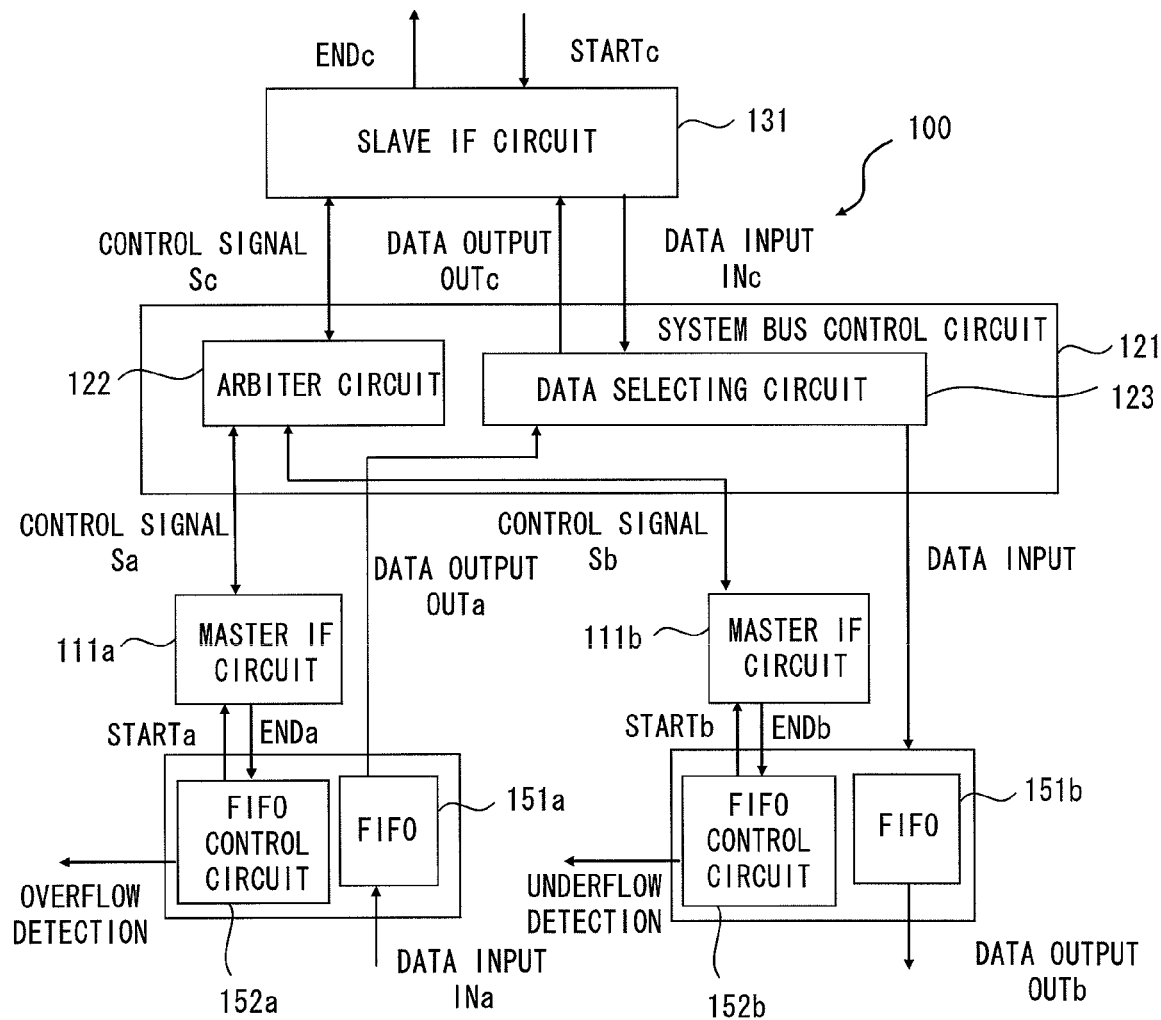
FIG. 5 shows a related semiconductor integrated circuit.
Figure 6:
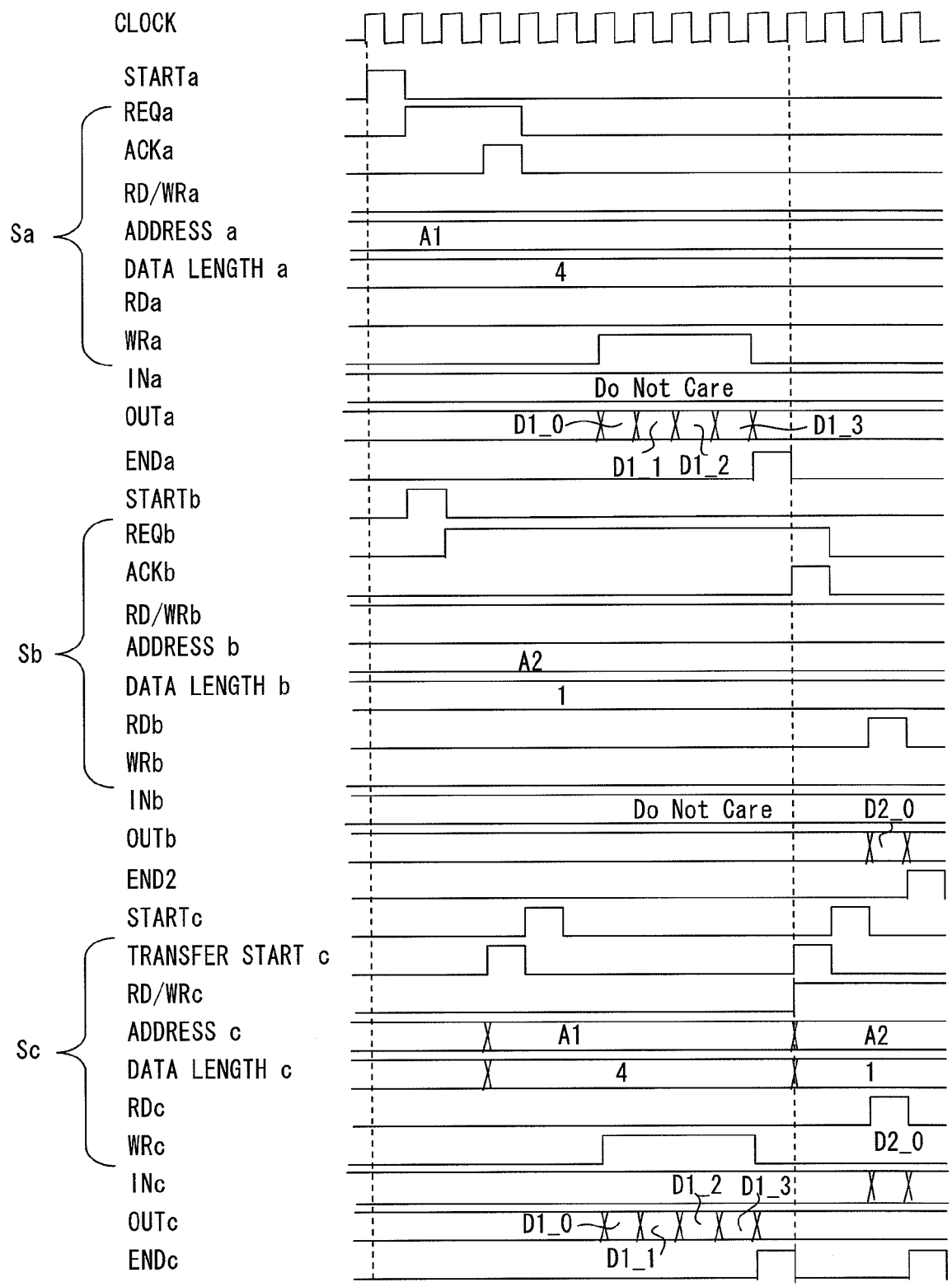
FIG. 6 shows a timing chart of each signal in the related semiconductor integrated circuit.

Next, an operation of the exemplary embodiment of the invention will be described. FIG. 4 is a timing chart showing each signal of the exemplary embodiment. The delay setting register 44a stores "11" by past transfer processing from the master IF circuit 11a to the system bus. Similarly, the delay setting register 44b stores "15" by past transfer processing from the master IF circuit 11b to the system bus.

An access to the system bus is finished in 10 clocks from input of a STARTa signal, and an ENDa signal is input to the master IF circuit 11a. Since the delay setting register 44a is set to "11", the delayed ENDa signal which is a transfer end signal to the FIFO control circuit 52a is input one clock later than the ENDa signal. Therefore, when there is data where data transfer should be continuously performed, the FIFO control circuit 52a outputs STARTa signal in one clock later than conventional. If this delay makes the FIFO 51a the state where the FIFO 51a cannot receive the data from the data input INa (a memory of the FIFO 51a is full), the FIFO control circuit 52a outputs an overflow detection signal to external. An ACKb which is a response signal of the system bus in response to a transfer request REQb signal from the master IF circuit 11b has a timing as same as conventional without being influenced by the influence of the delay of the ENDa signal.

An access to the system bus is finished in 13 clocks from input of the STARTb signal, and the ENDb signal is input into the master IF circuit 11b. As the delay setting register 44b is set to "15", a delayed ENDb signal which is a transfer end signal to the FIFO control circuit 52b is input two clocks later than the ENDb signal. Therefore, when there is data where data transfer should be continuously performed, the FIFO control circuit 52b outputs STARTb signal two clocks later than conventional. If this delay makes the FIFO 51b the state where the FIFO 51b cannot output the data to the data output OUTb (a memory of the FIFO 51b is empty), the FIFO control circuit 52b outputs an underflow detection signal to external.

In the exemplary embodiment, the same condition where the system bus is under a peak load with respect to the data transmitter and receiver circuit which is former stage of the master IF circuit can be created easily. Therefore it is possible to perform an operation check of a system LSI under this condition easily. In the related technique, it is extremely difficult to create this condition. If the ENDa signal is delayed with an amount which is measured by the maximum delay amount measurement circuit, the operation check in the delay condition of the system bus can be easily executed without changing the current construction of system including software and so on.

Furthermore, if the ENDa signal and the ENDb signal are delayed with the value set in the delay setting registers 44a, 44b by microcomputer, an operation check under a maximum delay which does not depend on an actual operation of the system can be performed easily.

While the invention has been described in terms of several exemplary embodiments, those skilled in the art will recognize that the invention can be practiced with various modifications within the spirit and scope of the appended claims and the invention is not limited to the examples described above.

For example, though the above embodiments describe a hardware configuration, the present invention is not limited thereto, and a given processing may be implemented by executing computer program on a central processing unit (CPU). In this case, the computer program may be provided by being recorded on a recording medium or by being transmitted through the Internet or other transmission media. And the first, second and third exemplary embodiments can be combined as desirable by one of ordinary skill in the art. The first to third exemplary embodiments can be combined as desirable by one of ordinary skill in the art.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a memory;
   a master interface circuit that performs one of receiving a data transfer request from the memory and outputting a data transfer request to the memory;
   a slave interface circuit that performs one of receiving data from the memory and outputting data to the memory in response to the data transfer requests; and
   a delay circuit that delays a data transfer end signal, the data transfer end signal indicating one of an end of a data transfer from the memory to the slave interface circuit through the master interface circuit and an end of a data transfer from the slave interface to the memory through the master interface circuit, and the data transfer end signal being sent from the master interface circuit to the memory.

2. The semiconductor integrated circuit according to claim 1, further comprises a selector that selects one of a delayed data transfer end signal and the data transfer end signal,
   wherein the delayed data transfer end signal is the data transfer end signal delayed by a delay time.

3. The semiconductor integrated circuit according to claim 2, wherein the delay time is set to the delay circuit from external.

4. The semiconductor integrated circuit according to claim 3, wherein the delay time is calculated based on a simulation.

5. The semiconductor integrated circuit according to claim 2, further comprises a delay amount setting circuit that sets the delay time.

6. The semiconductor integrated circuit according to claim 5, further comprises a maximum delay amount measurement circuit and a memory controller that controls the memory,
   wherein the maximum delay amount measurement circuit measures an amount of time from receipt of a data transfer start signal output from the memory controller to receipt of the data transfer end signal corresponding to the data transfer request from the master interface circuit, and stores a maximum delay amount based on the measurement result.

7. The semiconductor integrated circuit according to claim 6, wherein the delay amount setting circuit sets the maximum delay amount based on the measurement result of the maximum delay amount measurement circuit, and the delay circuit delays the data transfer end signal by the maximum delay amount.

8. The semiconductor integrated circuit according to claim 1, wherein the memory is a First-In First-Out (FIFO) memory.

9. The semiconductor integrated circuit according to claim 1, further comprises at least one of a decoder and an encoder, the decoder output data to the memory, and the encoder receives data from the memory.

10. The semiconductor integrated circuit according to claim 1, further comprises a system bus control circuit connected to the slave interface circuit and the master interface circuit, and performs arbitration of either of the data transfer requests.

11. A method of measuring a maximum delay of a semiconductor integrated circuit including a master interface circuit performing one of operations of outputting a data transfer request to transfer data from a memory to a slave interface circuit and receiving a data transfer request to transfer data from the slave interface circuit to the memory, and a slave interface circuit performing one of operations receiving the data transfer request from the master interface circuit and outputting the data transfer request to the master interface circuit, the method comprising:

inputting one of the data transfer request from the master interface circuit to the slave interface circuit through the master interface circuit and the data transfer request from the slave interface circuit to the memory through the master interface circuit;

delaying a data transfer end signal indicating an end of a data transfer to generate a delayed data transfer end signal, the data transfer end signal being sent from the master interface circuit to the memory; and transferring data either the memory to the slave interface circuit or from the slave interface circuit to the memory after receiving the delayed data transfer end signal.

12. The method of measuring a maximum delay of a semiconductor integrated circuit according to claim 11, wherein selecting the delayed data transfer end signal and inputting the delayed data transfer end signal to a memory controller controlling the memory in a test mode, and selecting the data transfer end signal and inputting the data transfer end signal to the memory controller in a non-test mode.

13. The method of measuring a maximum delay of a semiconductor integrated circuit according to claim 11, wherein the delaying a data transfer end signal is setting a delay amount for a delay circuit and delaying the data transfer end signal by the delay amount by the delay circuit.

14. The method of measuring a maximum delay of a semiconductor integrated circuit according to claim 13, wherein the delay amount is a predetermined delay amount input to the delay circuit.

15. The method of measuring a maximum delay of a semiconductor integrated circuit according to claim 11, further comprising:

measuring an amount of time from receipt of a data transfer start signal output from a memory controller to receipt of the data transfer end signal corresponding to the data transfer requests; and setting a maximum value for a delay circuit according to the measurement values.

* * * * *